(12) United States Patent
Kim et al.

(10) Patent No.: US 6,617,929 B2
(45) Date of Patent: Sep. 9, 2003

(54) FULL OUTPUT MATCHING APPARATUS OF A MICROWAVE DOHERTY AMPLIFIER

(75) Inventors: Bumman Kim, Pohang-shi (KR); Youngoo Yang, Pohang-shi (KR); Jaehyok Yi, Pohang-shi (KR); Young Yun Woo, Pohang-shi (KR)

(73) Assignee: Postech Foundation, Kyungsangbuk-do (KR)

( * ) Notice: Subject to any disclaimer, the term of this patent is extended or adjusted under 35 U.S.C. 154(b) by 0 days.

(21) Appl. No.: 10/076,636

(22) Filed: Feb. 19, 2002

(65) Prior Publication Data

US 2002/0135425 A1 Sep. 26, 2002

(30) Foreign Application Priority Data

Mar. 21, 2001 (KR) ........................................ 2001-14516

(51) Int. Cl.[7] .............................. H03F 3/68; H03F 3/60; H03F 3/04
(52) U.S. Cl. ..................... 330/295; 330/53; 330/124 R; 330/286; 330/302
(58) Field of Search ............................... 330/53, 124 R, 330/286, 295, 302

(56) References Cited

U.S. PATENT DOCUMENTS

| | | | | |
|---|---|---|---|---|
| 5,568,086 A | * | 10/1996 | Schuss et al. | 330/124 R |
| 5,786,727 A | * | 7/1998 | Sigmon | 330/124 R |
| 6,356,149 B1 | * | 3/2002 | Stengel et al. | 330/107 |
| 6,396,341 B1 | * | 5/2002 | Pehlke | 330/10 |
| 6,472,934 B1 | * | 10/2002 | Pehlke | 330/10 |

* cited by examiner

*Primary Examiner*—Patricia Nguyen
(74) *Attorney, Agent, or Firm*—Bacon & Thomas, PLLC (57) ABSTRACT

Quarter wave transformers are connected to final outputs of a carrier amplifier and a peaking amplifier, which are coupled in parallel to each other, so as to induce a Doherty operation of a microwave Doherty amplifier. Load matching circuits for obtaining a microwave output matching are connected to output terminals of the carrier amplifier and the peaking amplifier. A phase tuning component is positioned behind the load matching circuit. Accordingly, a matching state can be maintained without being changed at a high power level but can be adjusted depending on phase variations at a low power level to attain efficiency enhancements and optimum linearity.

8 Claims, 9 Drawing Sheets

FIG.6B

US 6,617,929 B2

FULL OUTPUT MATCHING APPARATUS OF A MICROWAVE DOHERTY AMPLIFIER

FIELD OF THE INVENTION

The present invention relates to an output matching apparatus of a microwave Doherty amplifier; and, more particularly, to a full output matching apparatus of a microwave Doherty amplifier capable of obtaining a full output matching at a super high frequency band by performing an additional phase tuning process after a conventional microwave output matching of the Doherty amplifier.

BACKGROUND OF THE INVENTION

As is well known, a microwave Doherty amplifier is a high efficiency amplifier capable of performing only a genuine resistive output matching process. The Doherty amplifier generally uses two amplifier paths, a carrier amplifier and a peaking amplifier, and controls a load line impedance of the carrier amplifier by varying, depending on a power level, an amount of current provided from the peaking amplifier to a load. To perform such a function of high efficiency, the Doherty amplifier employs a technique where the carrier amplifier and the peaking amplifier are connected in parallel to each other by a quarter wave transformer ($\lambda/4$ line).

Figure 1:
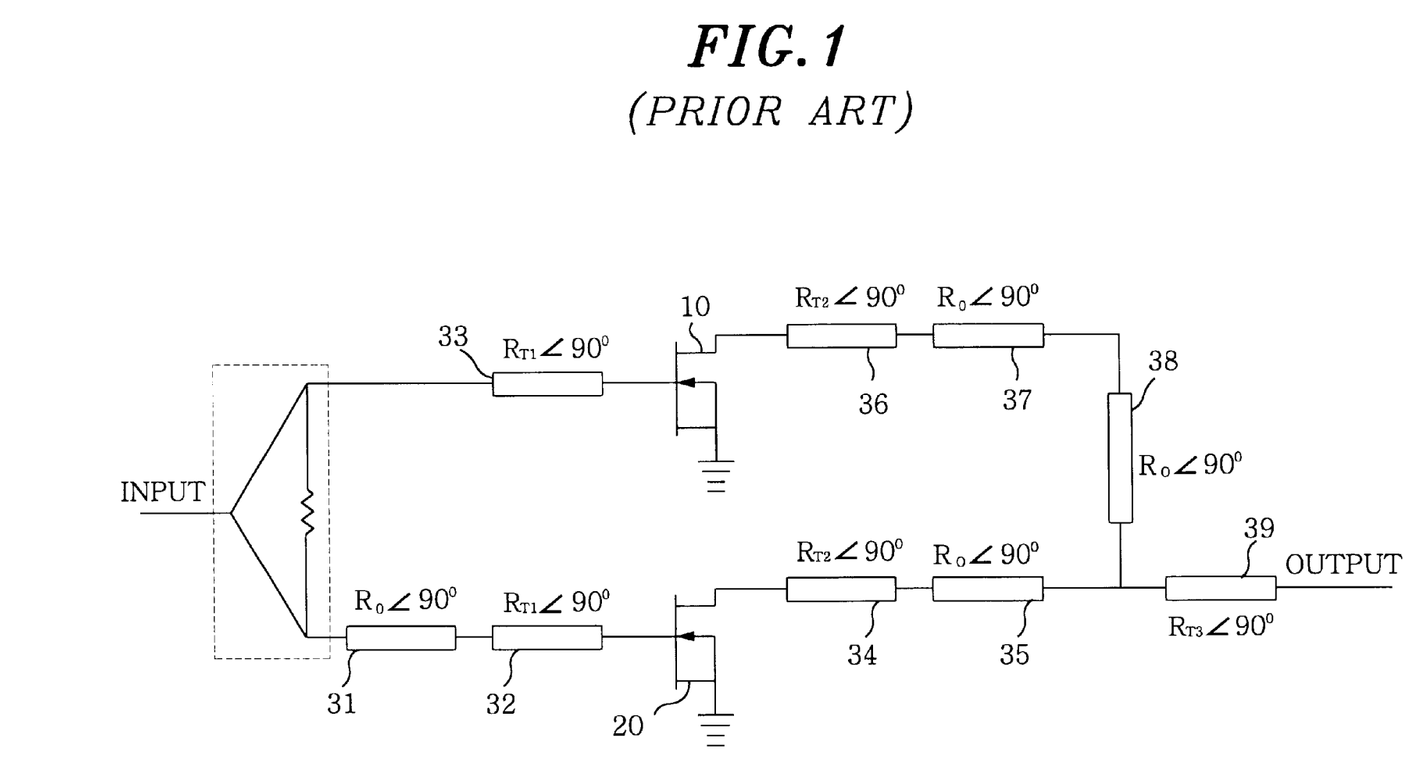
FIG. 1 is a block diagram of a microwave Doherty amplifier using a conventional output matching apparatus.

The microwave Doherty amplifier was used in earlier days as an AM transmitter of a broad casting apparatus using a high-power LF/MF vacuum tube. Then, various suggestions have been made to apply the Doherty amplifier to a solid-state high-power transmitter. FIG. 1 shows one of such suggestions.

The microwave Doherty amplifier in FIG. 1 uses quarter wave transformers 31 to 39 for an output matching of a carrier amplifier 10 and a peaking amplifier 20. In this output matching system, only a resistive matching is possible.

Figure 2:
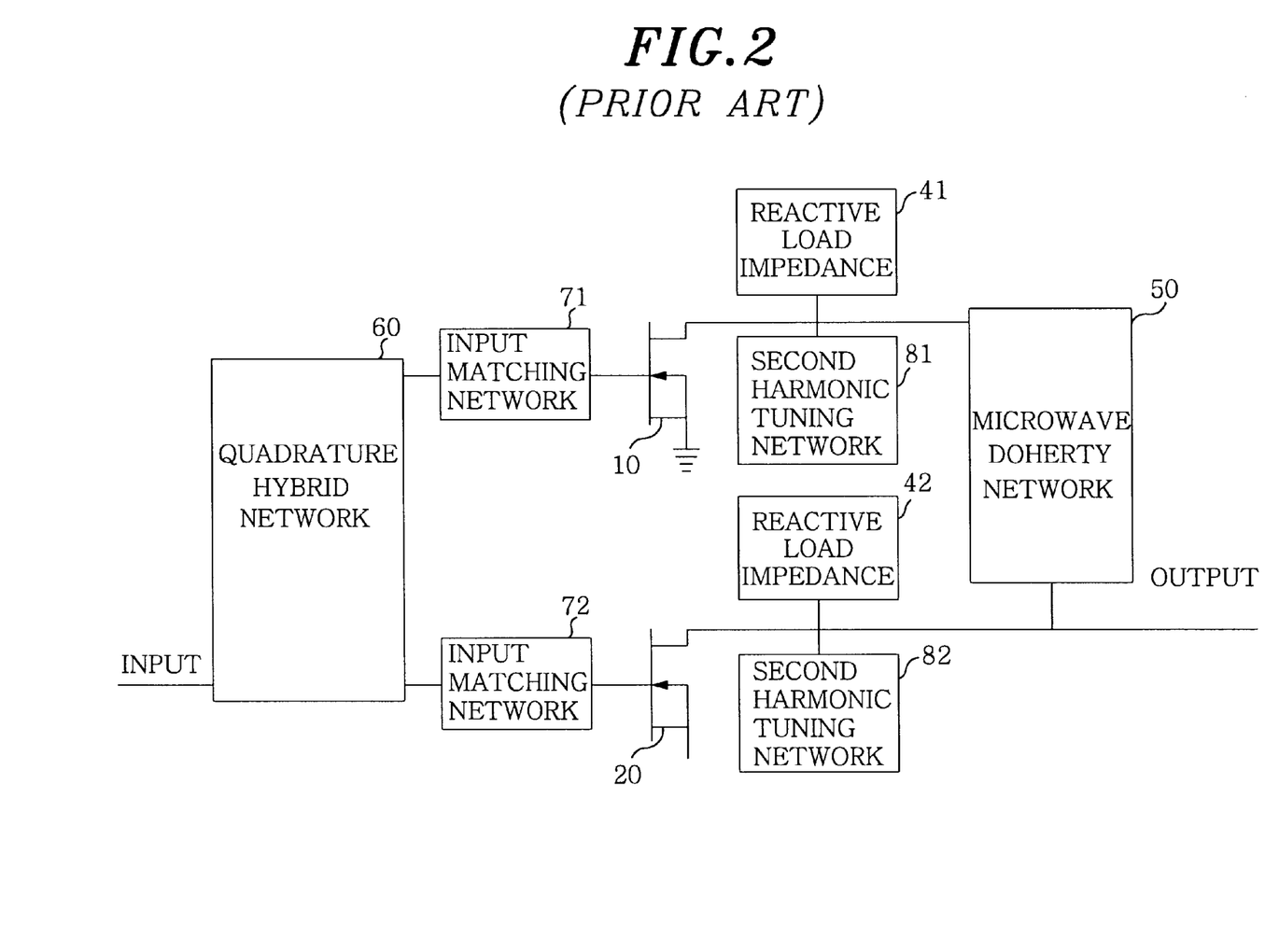
FIG. 2 depicts a block diagram of a microwave Doherty amplifier using another conventional output matching apparatus.

Referring to FIG. 2, there is provided a microwave Doherty amplifier using another conventional output matching system. Shunt reactive load impedances 41 and 42 are connected to an output section of the carrier amplifier 10 and the peaking amplifier 20, respectively. Further, a microwave Doherty network 50 is coupled to the output sections of the carrier amplifier 10 and the peaking amplifier 20. However, this conventional output matching system also has a drawback in that an output matching may not be obtained for both real and imaginary parts and the shunt reactive load impedances 41 and 42 may deteriorate the efficiency of the Doherty amplifier.

Accordingly, there has been intensified a demand for a full output matching apparatus capable of obtaining a full output matching for both real and imaginary parts while preserving a highly improved efficiency of the solid-state microwave Doherty amplifier.

SUMMARY OF THE INVENTION

It is, therefore, an object of the present invention to provide a full output matching apparatus of a Doherty amplifier which uses a characteristic impedance line added after an output matching of a microwave Doherty amplifier as a phase tuning component such that a matching state can be maintained without being changed at a high power level but can be adjusted depending on a phase variation at a low power level to obtain efficiency enhancements and optimum linearity.

In accordance with the present invention, there is provided a microwave Doherty amplifier for inducing a Doherty operation, wherein quarter wave transformers are connected to a final output of a carrier amplifier and a peaking amplifier coupled in parallel to each other, the Doherty amplifier comprising: a load matching circuit connected to output terminals of the carrier amplifier and the peaking amplifier so as to obtain a microwave output matching; and a phase tuning component located behind the load matching circuit.

BRIEF DESCRIPTION OF THE DRAWINGS

The above and other objects and features of the present invention will become apparent from the following description of a preferred embodiment given in conjunction with the accompanying drawings, in which.

DETAILED DESCRIPTION OF THE PREFERRED EMBODIMENT

Figure 3:
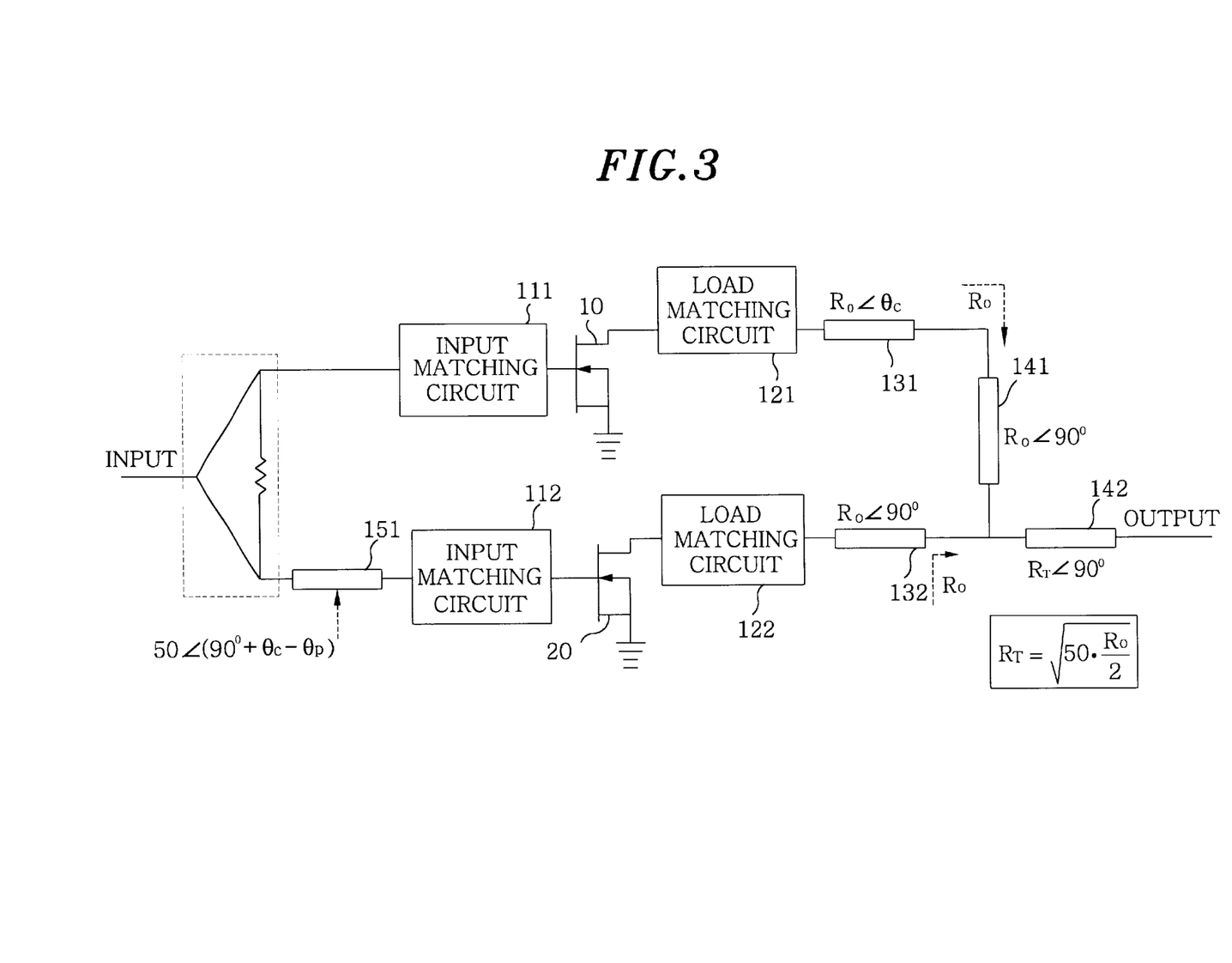
FIG. 3 sets forth a block diagram of a microwave Doherty amplifier using an output matching apparatus in accordance with the present invention.

Referring to FIG. 3, there is provided a microwave Doherty amplifier using an output matching apparatus in accordance with the present invention.

The output matching apparatus includes a carrier amplifier 10, a peaking amplifier 20, input matching circuits 111 and 112, a load matching circuit 121 for the carrier amplifier 10, a load matching circuit 122 for the peaking amplifier 20, an impedance line 131 having an angle of $\theta_c$ and an impedance line 132 having an angle of $\theta_p$. The input matching circuits 111 and 112 are disposed in front of the carrier amplifier 10 and the peaking amplifier 20, respectively. The load matching circuits 121 and 122 are connected to an output section of the carrier amplifier 10 and the peaking amplifier 20, respectively, such that a characteristic impedance becomes an arbitrary impedance $R_O$. The impedance lines 131 and 132 are positioned behind the load matching circuits 121 and 122, respectively.

Quarter wave transformers 141 and 142 are positioned behind the impedance lines 131 and 132, respectively, to cause a Doherty operation.

In order to compensate a phase difference between a first path and a second path, the first path including the impedance line 131 with angle $\theta_c$ and the quarter wave transformer 141 and the second path including the impedance line 132 with angle $\theta_p$ and the quarter wave transformer 142, an impedance line 151 with an angle $90°+\theta_c-\theta_p$ is additionally inserted in front of the input matching circuit 112 of the peaking amplifier 20.

Figure 4A:
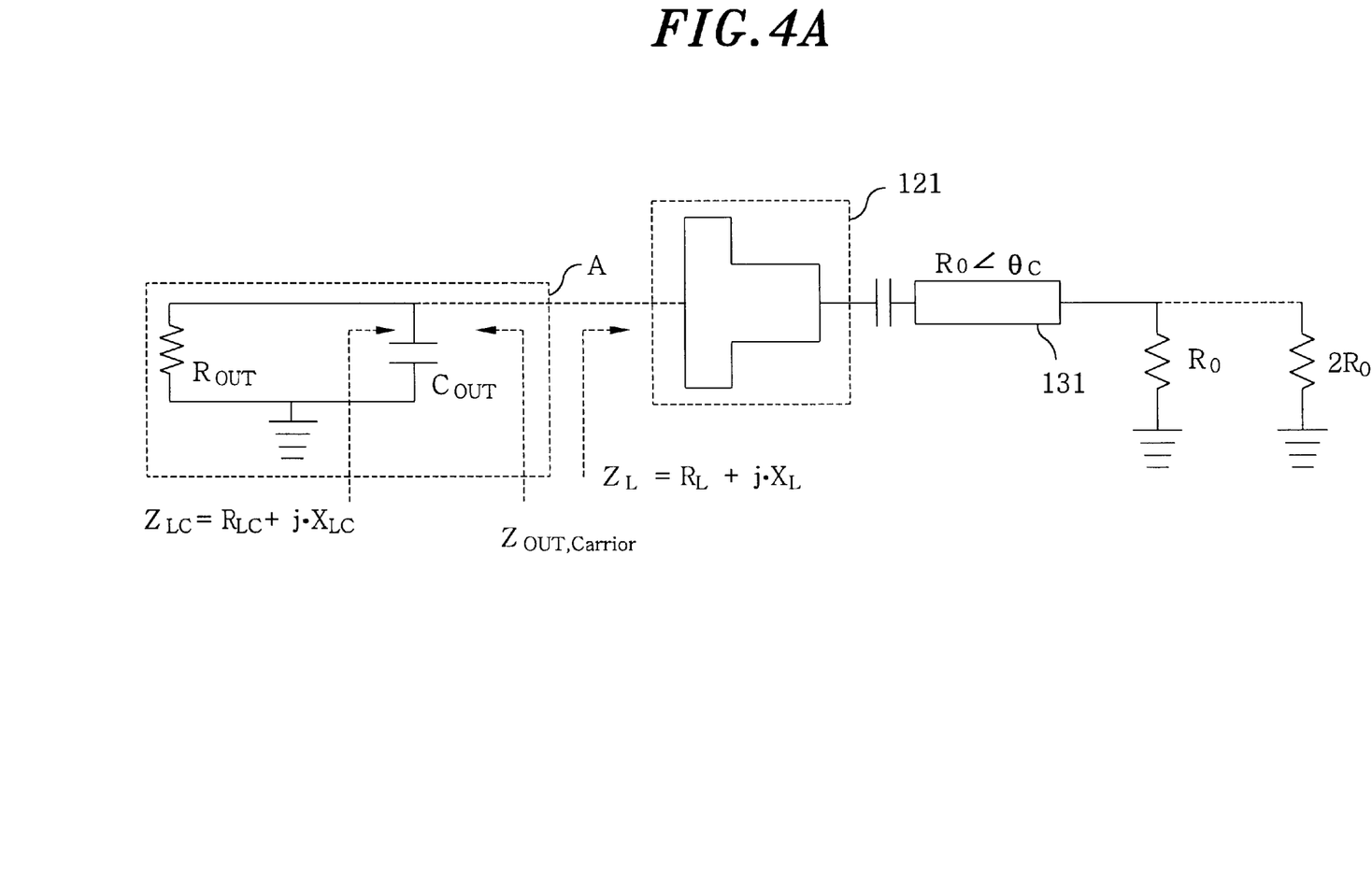
FIGS. 4A and 4B offer detailed circuit diagrams of the output matching apparatus in accordance with the present invention.
Figure 4B:
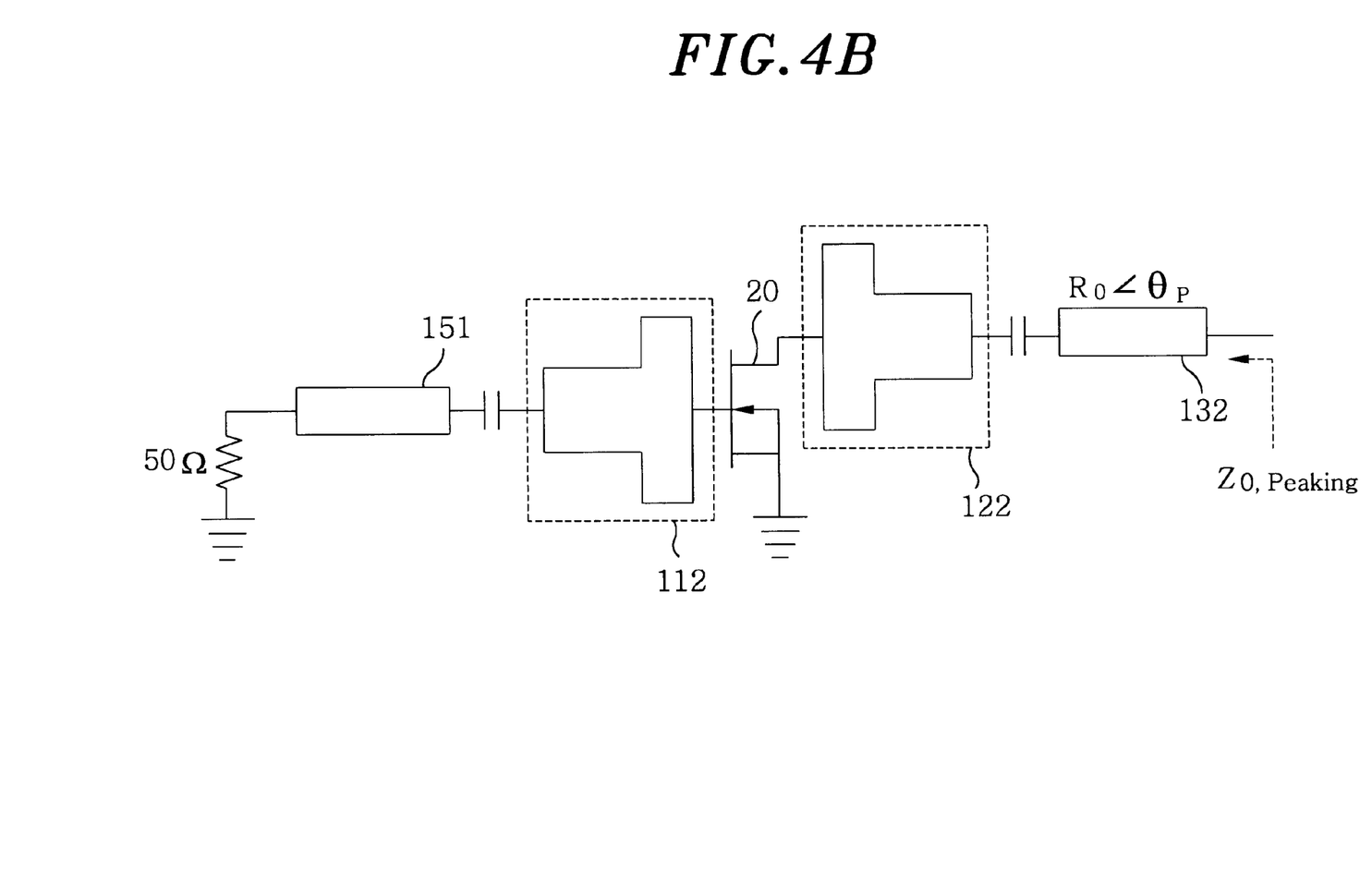

FIGS. 4A and 4B are circuit diagrams for describing a method for calculating $\theta_c$ of the impedance line 131 and $\theta_p$ of the impedance line 132, respectively.

Referring to FIG. 4A, an output resistance $R_{OUT}$ and an output capacitor $C_{OUT}$ are connected to each other by a shunt function together as an equivalent circuit (A in FIG. 4A) of an output impedance $Z_{OUT,Carrier}$ of the carrier amplifier 10. In this case, in order to obtain a matching at an optimum power level, the load resistance $R_L$ is calculated from an I/V relationship of the transistor 10 and the imaginary part $X_L$ is determined to be an imaginary part of a complex conjugate of the output impedance $Z_{OUT,Carrier}$.

Accordingly, the compensated load impedance looking towards the load including the capacitor $C_{OUT}$ comes to have a real value for the capacitor $C_{OUT}$ and the final load impedance $R_0$. Since the final load impedance of the carrier amplifier 10 becomes $R_0$ at a high power level, the load impedance $Z_{LC,R_0}$ compensated by a phase tuning component having the characteristic impedance of $R_0$ is not changed.

However, since a final output load impedance of the carrier amplifier 10 is found to be $2R_0$ at a very low power level due to the Doherty operation, a compensated load impedance $Z_{LC,2R_0}$ at this time is found to form a circle centering around a compensated load impedance $Z_{LC,R_0}$ at a high power level depending on phase variations of a phase tuning component $\theta_c$.

Figure 5A:
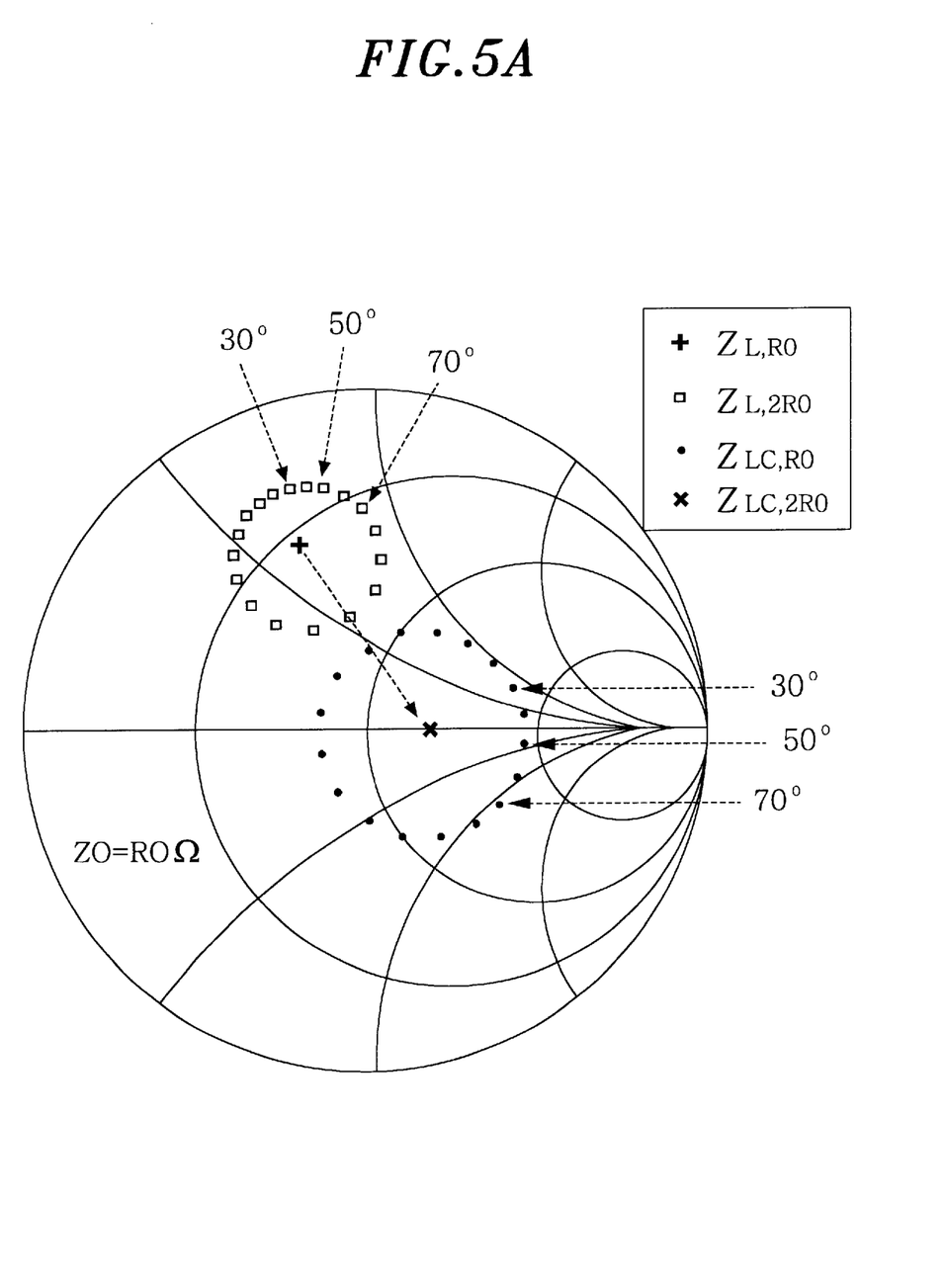
FIGS. 5A and 5B describe variations of a load impedance and an output impedance when a phase of a phase tuning component inserted into the output matching apparatus in FIG. 4 changes from 0° to 180°.

FIG. 5A describes characteristics of the load impedance described above. Herein, the phase tuning component $\theta_c$ is determined to be an angle that allows the compensated load impedance $Z_{LC,2R_0}$ to be a real maximum value. In FIG. 5A, when the phase tuning component $\theta_c$ ranges from 40° to 60°, the compensated load impedance is found to be a maximum value close to a real number.

Figure 5B:
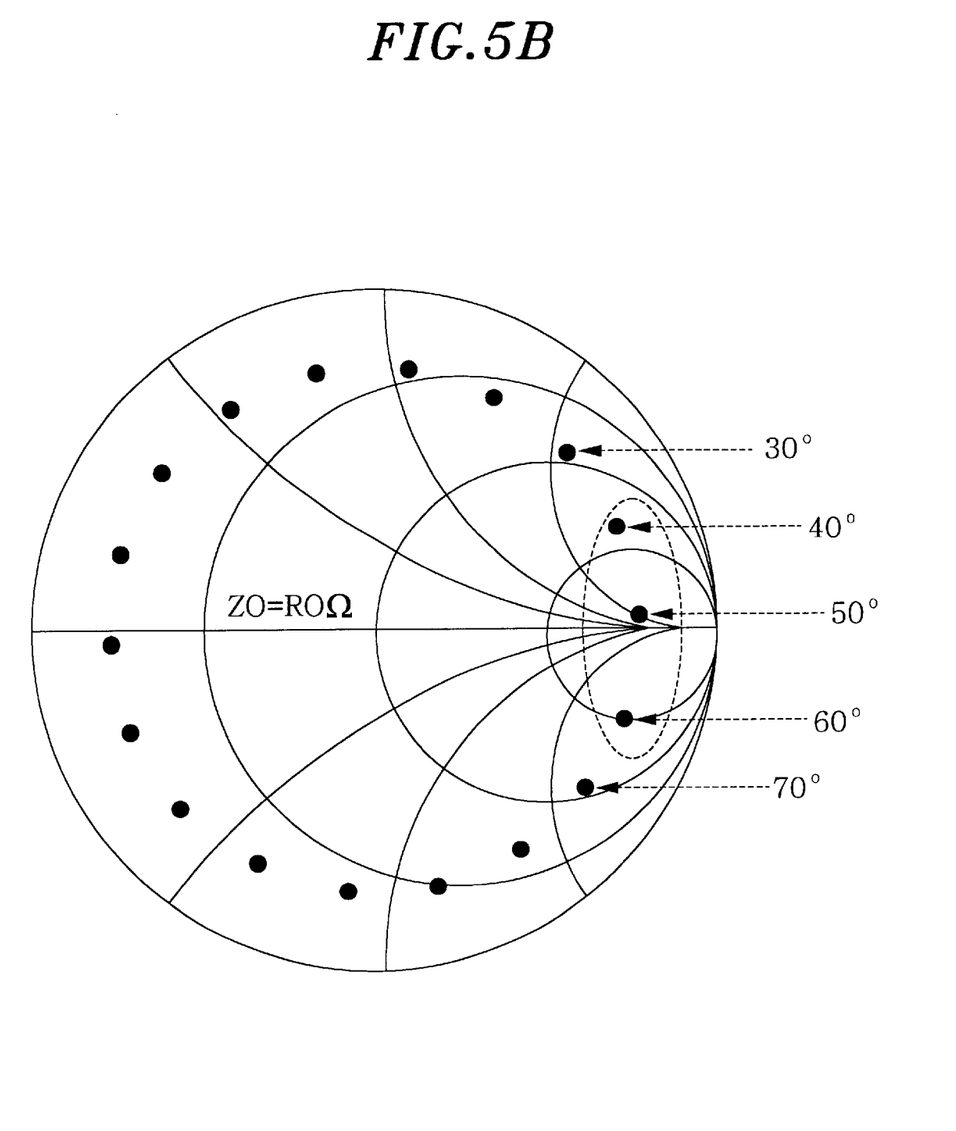

In a similar way as described in FIGS. 4A and 5A, a final output impedance of the peaking amplifier 20, the final output impedance including the phase tuning component, forms a large circle depending on phase variations of the phase tuning component $\theta_p$ at the very low power level. Since the output impedance $Z_{O,peaking}$ at the very low power level should be opened, it is preferable that $\theta_p$ has a value that allows the output impedance $Z_{O,peaking}$ to have a genuine resistive component of a real number. In FIG. 5B, it is found that the final output impedance of the peaking amplifier 20 has a very large real value when $\theta_p$ has an angel ranging from 40° to 60°.

Figure 6A:
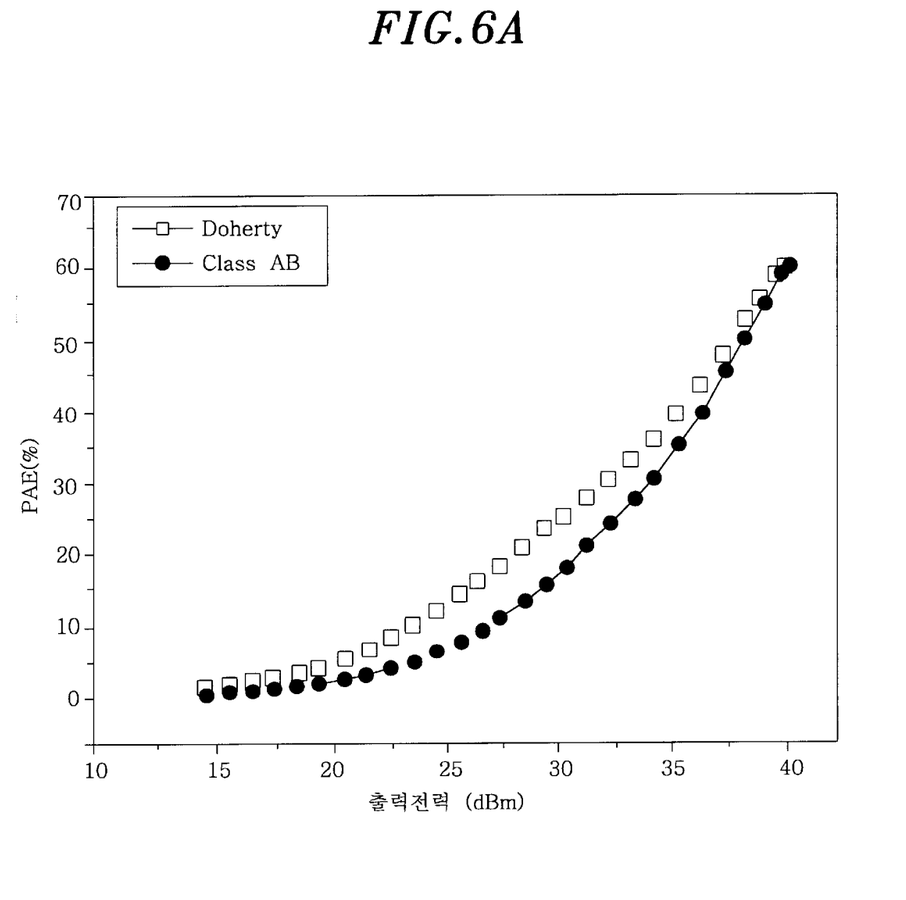
FIGS. 6A and 6B provide experimental data of a microwave Doherty amplifier using the output matching apparatus in accordance with the present invention.
Figure 6B:
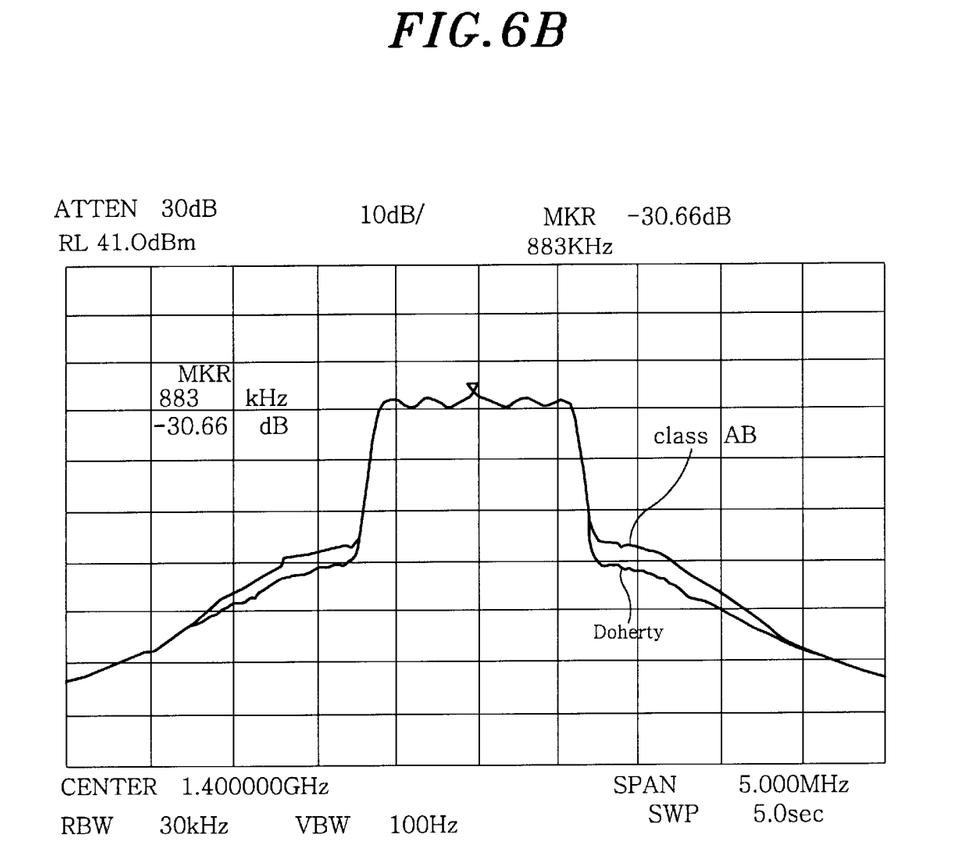

In the following, characteristics of a microwave Doherty amplifier operating at a frequency band near 1.4 GHz, which was implemented in accordance with the above-described preferred embodiment of the present invention, will be described. The Doherty amplifier employed a class AB amplifier as the carrier amplifier and a class C amplifier as the peaking amplifier. Referring to FIG. 6A, there is provided a table that shows power-added efficiencies (PAE) of the microwave Doherty amplifier of the present invention and the conventional class AB amplifier when a CW signal is inputted thereto. It will be apparent to those skilled in the art that the Doherty amplifier using the output matching apparatus of the present invention exhibits a still higher efficiency. FIG. 6B offers a spectrum of each of the conventional AB amplifier and the Doherty amplifier in accordance with the present invention. In comparing a linearity characteristic of the Doherty amplifier of the present invention with that of the AB class amplifier when an IS-95 Forward-Link CDMA signal is inputted thereto, the Doherty amplifier in accordance with the present invention shows an adjacent channel leakage ratio (ACLR) of about 5.7 dB lower than that of the AB amplifier at a 885 kHz offset point at an output power of about 32 dBm.

In accordance with the present invention as described above, an impedance line such as a characteristic impedance is added and used as a phase tuning component after a microwave output matching performance of a microwave Doherty amplifier. Thus, a matching state can be maintained without being changed at a high power level but can be adjusted at a low power level depending on phase variations to attain efficiency enhancements and optimum linearity.

The output matching apparatus of the present invention particularly exhibits highly reliable efficiency and highly improved linearity when it is applied to a power amplifier for a base station in a conventional or next-generation mobile communications system.

What is claimed is:

1. A microwave Doherty amplifier for inducing a Doherty operation, wherein quarter wave transformers are connected to final outputs of a carrier amplifier and a peaking amplifier coupled in parallel to each other, the Doherty amplifier comprising:

a first load matching circuit connected to an output terminal of the carrier amplifier so as to obtain a microwave output matching for an output impedance of the carrier amplifier;

a second load matching circuit connected to an output terminal of the peaking amplifier so as to obtain a microwave output matching for an output impedance of the peaking amplifier;

a first phase tuning component for adjusting a phase of a first equivalent circuit including the carrier amplifier and the first load matching circuit to obtain an output matching for both real and imaginary parts of an output impedance of the first equivalent circuit, which is located behind the first load matching circuit; and a second phase tuning component for adjusting a phase of a second equivalent circuit including the peaking amplifier and the second load matching circuit to obtain an output matching for both real and imaginary parts of an output impedance of the second equivalent circuit, which is located behind the second load matching circuit.

2. The Doherty amplifier of claim 1, wherein the first phase tuning component includes an impedance line positioned behind the first load matching circuit, a phase of the impedance line being controlled so that the output impedance of the first equivalent circuit has a maximum real value.

3. The Doherty amplifier of claim 1, wherein the second phase tuning component includes an impedance line positioned behind the second load matching circuit, a phase of the impedance line being controlled so that the output impedance of the second equivalent circuit has a maximum real value.

4. The Doherty amplifier of claim 1, further comprising a phase delay circuit disposed in front of the peaking amplifier to compensate a phase difference between the quarter wave transformers and the difference between the quarter wave transformers and the first and second phase tuning components, wherein a phase delay performed by the phase delay circuit cancels the phase difference.

5. A microwave Doherty amplifier for inducing a Doherty operation, comprising:

a carrier amplifier for amplifying an input signal;

a first input matching circuit for matching a load between an input of the Doherty amplifier and the carrier amplifier;

a first load matching circuit connected to an output of the carrier amplifier to obtain a microwave output matching for an output impedance of the carrier amplifier;

a first phase tuning component for adjusting a phase of an first equivalent circuit including the first input matching circuit, the carrier amplifier and the first load matching circuit to obtain an output matching fir both real and imaginary parts of an output impedance of the first equivalent circuit, which is coupled to an output of the first load matching circuit;

a first quarter wave transformer for shifting an output of the first phase turning component by a quarter wavelength;

a peaking amplifier for amplifying the input signal;

a second input matching circuit for matching a load between an input of the Doherty amplifier and the peaking amplifier;

a second load matching circuit connected to an output of the peaking amplifier to obtain a microwave output matching for an output impedance of the peaking amplifier;

a second phase tuning component for adjusting a phase of a second equivalent circuit including the second input matching circuit, the peaking amplifier and the second load matching circuit to obtain an output matching for both real and imaginary parts of an output impedance of the second equivalent circuit, which is coupled to an output of the second load matching circuit; and a second quarter wave transformer for shifting a combined output of the first quarter wave transformer and the second phase turning component by a quarter wavelength.

6. The Doherty amplifier of claim 5, wherein the first phase tuning component includes an impedance line coupled to an output of the first load matching circuit, a phase of the impedance line being controlled so that the output impedance of the first equivalent circuit has a maximum real value.

7. The Doherty amplifier of claim 5, wherein the second phase tuning component includes an impedance line positioned behind the second load matching circuit, a phase of the impedance line being controlled so that the output impedance of the second equivalent circuit has a maximum real value.

8. The Doherty amplifier of claim 5, further comprising a phase delay circuit disposed in front of the second input matching circuit to compensate for a phase difference between a first path and a second path, the first path including the first quarter wave transformer and the first phase tuning component and the second path including the second phase tuning component.

* * * * *